United States Patent [19]

Chan et al.

[11] Patent Number: 5,660,570

[45] Date of Patent: Aug. 26, 1997

[54] MICRO EMITTER BASED LOW CONTACT FORCE INTERCONNECTION DEVICE

[75] Inventors: Chung Chan, West Newton, Mass.; Keith Warner, Warwick, R.I.; George B. Cvijanovich, Winston-Salem, N.C.

[73] Assignee: Northeastern University, Boston, Mass.

[21] Appl. No.: 402,140

[22] Filed: Mar. 10, 1995

Related U.S. Application Data

[63] Continuation-in-part of Ser. No. 58,323, May 6, 1993, abandoned, which is a continuation of Ser. No. 682,648, Apr. 9, 1991, Pat. No. 5,245,248.

[51] Int. Cl.⁶ .................................................. H01J 1/30
[52] U.S. Cl. .......................... 439/886; 439/950; 200/267
[58] Field of Search .............................. 313/308, 309, 313/336, 351, 495; 445/50–52; 357/68; 439/290, 291, 74, 886, 894, 950; 200/267

[56] References Cited

U.S. PATENT DOCUMENTS

| | | | |
|---|---|---|---|
| 3,293,509 | 12/1966 | Emeis | 317/234 |
| 3,776,752 | 12/1973 | Craven | 117/10 |
| 3,789,471 | 2/1974 | Spindt et al. | 29/25.17 |
| 3,871,008 | 3/1975 | Debesis | 357/65 |
| 3,970,887 | 7/1976 | Smith et al. | 313/309 |
| 3,998,678 | 12/1976 | Fukase et al. | 156/3 |
| 4,163,949 | 8/1979 | Shelton | 328/254 |
| 4,172,912 | 10/1979 | Noji et al. | 427/375 |
| 4,178,531 | 12/1979 | Alig | 313/409 |
| 4,407,695 | 10/1983 | Deckman et al. | 156/643 |
| 4,513,308 | 4/1985 | Greene et al. | 357/55 |
| 4,551,649 | 11/1985 | Olson | 313/336 |
| 4,663,559 | 5/1987 | Christensen | 313/336 |
| 4,664,748 | 5/1987 | Ueno et al. | 156/659.1 |
| 4,685,996 | 8/1987 | Busta et al. | 156/628 |
| 4,701,366 | 10/1987 | Deckman et al. | 428/188 |
| 4,721,885 | 1/1988 | Brodie | 313/576 |
| 4,818,914 | 4/1989 | Brodie | 315/169.3 |
| 4,857,161 | 8/1989 | Borel et al. | 204/192.26 |
| 4,857,799 | 8/1989 | Spindt et al. | 313/495 |
| 4,901,028 | 2/1990 | Gray et al. | 330/54 |
| 4,902,930 | 2/1990 | Van Der Mast | 315/12.1 |
| 4,906,840 | 3/1990 | Zdeblick et al. | 250/306 |
| 4,912,822 | 4/1990 | Zdeblick et al. | 29/25.35 |
| 4,940,916 | 7/1990 | Borel et al. | 313/306 |
| 4,956,574 | 9/1990 | Kane | 313/306 |
| 4,983,878 | 1/1991 | Lee et al. | 313/308 |
| 5,018,003 | 5/1991 | Chason | 445/24 |
| 5,047,830 | 9/1991 | Grabbe | 357/68 |
| 5,064,396 | 11/1991 | Spindt | 445/50 |
| 5,105,537 | 4/1992 | Datta et al. | 29/884 |
| 5,118,299 | 6/1992 | Burns et al. | 439/74 |
| 5,137,461 | 8/1992 | Bindra et al. | 439/886 |

FOREIGN PATENT DOCUMENTS 2816328  10/1978  Germany.

OTHER PUBLICATIONS

Woolnough, Roger: "Microtips tech may spawn a flat CRT," *Electronic Engineering Times*, Jan. 14, 1991, p. 35 (first article only).

*Primary Examiner*—Neil Abrams
*Attorney, Agent, or Firm*—Weingarten, Schurgin, Gagnebin & Hayes LLP

[57] ABSTRACT

An interconnection device is disclosed for providing electrical connection between two conducting elements that requires less applied force than a standard ohmic connection device of the same connection area. A surface of at least a first conducting element includes a plurality of atomically sharp projections for creating a strong electric field near the tip of each projection, each projection being disposed within a locally depressed portion of an insulating layer that serves to maintain a space between each tip and a second conducting element that contacts the insulating layer. The strong electric field at each tip induces a variety of conduction modes each contributing to an aggregate current flow from the first conducting element to the second. In an alternate embodiment, a plurality of projections are disposed on the peaks and valleys of a rough surface without an insulating layer, the projections providing a variety of conduction modes.

7 Claims, 5 Drawing Sheets

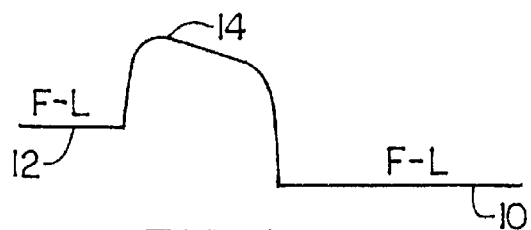
FIG. 1
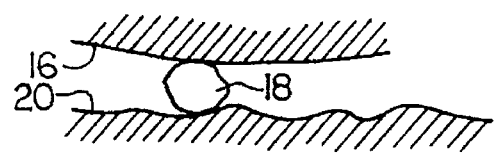
FIG. 2A
FIG. 2B
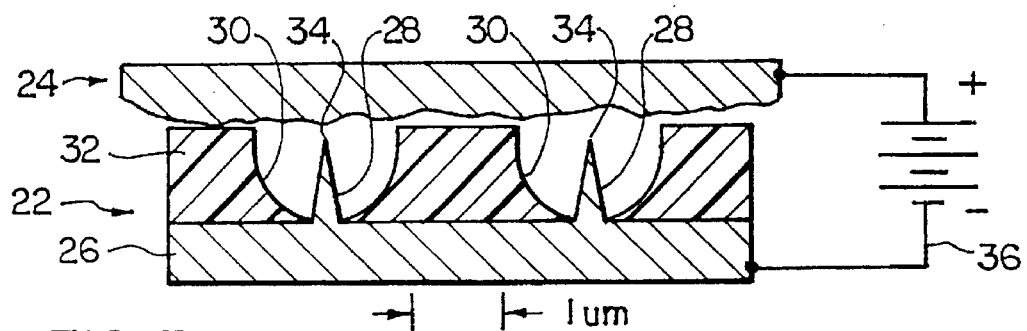
FIG. 3
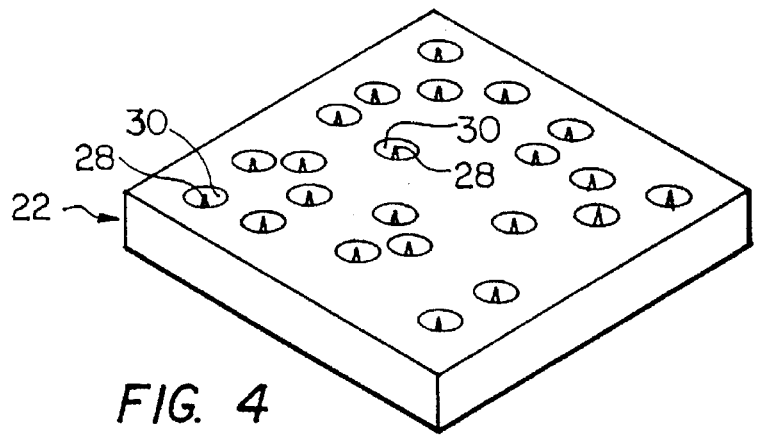
FIG. 4
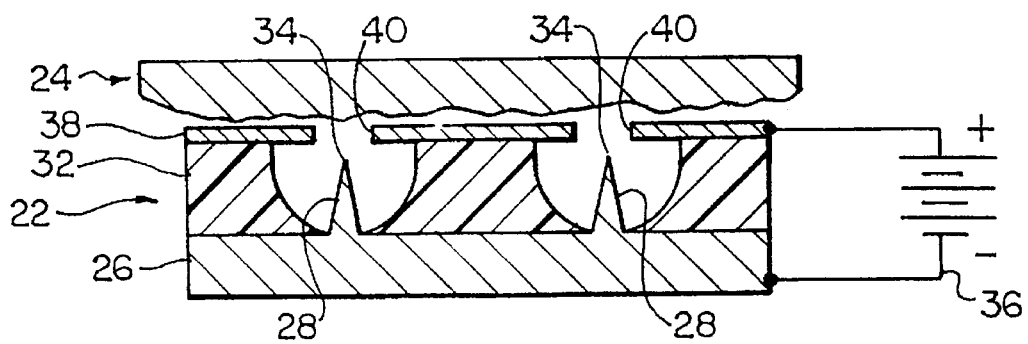
FIG. 5

MICRO EMITTER BASED LOW CONTACT FORCE INTERCONNECTION DEVICE

RELATED CASES

This patent application is a continuation-in-part of U.S. patent application Ser. No. 08/058,323 filed May 6, 1993 (now abandoned) which is a continuation of U.S. patent application Ser. No. 07/682,648 filed Apr. 9, 1991 which issued on Sep. 14, 1993 as U.S. Pat. No. 5,245,248.

FIELD OF THE INVENTION

This invention relates to interconnection devices, and more particularly to low-contact-force interconnection devices.

BACKGROUND OF THE INVENTION

In known electrical interconnection devices, electrical connection between two conducting elements is achieved by bringing them into physical contact such that an ohmic connection is formed. Such an ohmic connection is characterized by a contact resistance. On a microscopic scale, current is transferred between the two conducting elements via randomly distributed load-bearing areas, referred to as a-spots, that form between the elements when they are in mutual contact. Increasing the mechanical force that brings the elements into contact tends to increase the number and size of the a-spots. Accordingly, the a-spots contribute a constriction resistance to the contact resistance, the constriction resistance being proportional to the mechanical force applied between the elements, where the constriction resistance is described by:

$$R_S = \rho/na \qquad \text{(Eq. 1)}$$

where $\rho$ is the resistivity of the conducting element, n is the number of a-spots created, and a is the average linear dimension of the a-spots. Since the dominant conduction mechanism is ohmic, the contact resistance is constant over a wide voltage range.

It is common for an insulating surface film of lubricant, metal oxide, or other contaminant to be found on the contacting surface of one or both contact elements, thereby contributing an additional resistance referred to as an effective resistance. Consequently, the contact resistance is the sum of the constriction resistances and the effective resistances of the respective surfaces.

If the surface film is thin, i.e., less than 100 Ångstroms, some conduction will occur due to electron tunneling through the film. Such tunneling can occur by several mechanisms. As illustrated in FIG. 1, when a voltage is applied across the contacts, the Fermi level 10 of the metal constituting the positive contact is lower than the Fermi level 12 of the metal of the negative contact. Although electrons at the Fermi level 12 will not have enough energy to cross over the potential barrier 14 at the metal-film interface, there will be some probability that electrons will "tunnel" through this barrier, in accordance with Schrodinger's equation from elementary quantum mechanics. Thus, a small but measurable current will flow, despite the presence of the insulating surface film on the contact elements.

As the applied voltage over the surface of the contact elements is increased to, for example, $10^6$ V/cm, a second effect, known as field emission, takes place. This effect is described by the Fowler-Nordheim equation, which is approximately:

$$J = AE^2/\phi \exp[-B\phi^{3/2}/E] \qquad \text{(Eq. 2)}$$

where J is the current density, E is the electric field, $\phi$ is the work function of the material, and A and B are constants.

In present-day connector technology, the total tunneling current is a very small fraction, typically $10^{-6}$ to $10^{-3}$ of the total current carried by the a-spots. This is because the radius of curvature of the a-spots, typically $10^4$ Å to $10^5$ Å, is large enough to promote ohmic conduction.

If the surface film is too thick to allow electron tunneling, another phenomena, known as "fritting" occurs. In high applied electric fields, such as fields greater than $10^6$ V/cm, electrons injected into the film due to field emission cause an avalanche breakdown of the film at the point of injection. A channel created by the breakdown causes localized heating of the contacts, which softens the metal surface and thereby causes an a-spot. This a-spot will widen as the current conducted through the a-spot increases. Note that fritting occurs at sites similar to those that cause tunneling, i.e., at protuberances at the contact surface, the protuberances serving to concentrate the electric field.

The presence of particulate contaminants, such as dust, on the surface of the conducting elements further increases the contact resistance. This occurs by imposing a barrier to complete contact closure. Referring to FIG. 2A, if the metal of the conducting element 16 is softer than the dust particle 18 in contact therewith, it will take an amount of force proportional to the hardness of the metal to deform the contact enough to cause complete contact closure between the element 16 and a complementary element 20, as shown in FIG. 2B. For a particle with a cross-sectional area A, the mechanical pressure P applied to the contact is:

$$P > AH \qquad \text{(Eq.3)}$$

where H is the hardness of the contact metal. For particles of 2 $\mu m^2$–200 $\mu m^2$ area and H values of $10^9$ N/m², P must be greater than 20 grams of force in order to insure contact. For devices with many concurrent contact elements, such as pin-grid arrays, such a high P value per contact element results in unacceptably high total applied pressure. For example, a 300 pin-grid array socket would require a total applied pressure of 6 kg to provide reliable contact.

SUMMARY OF THE INVENTION

An interconnection device is disclosed for providing electrical connection between two conducting elements that requires less applied force than a standard ohmic connection device of the same connection area. A surface of at least a first conducting element includes a plurality of atomically sharp projections for creating a strong electric field near the tip of each projection, each projection being disposed within a locally depressed portion of an insulating layer that serves to maintain a space between each tip and a second conducting element that contacts the insulating layer. The strong electric field near each tip induces a variety of conduction modes each contributing to an aggregate current flow from the first conducting element to the second. The projections are distributed with an area density sufficient to provide a current density per unit area at least as great as a standard ohmic connection of the same area, yet with significantly lower contact force, or a standard ohmic connection of significantly less area with the same contact force. To further increase the area density of projections, thereby increasing the number of conduction sites, an alternate embodiment includes projections on both the first and second conducting elements. In a further alternate embodiment, a metal layer resides upon the insulating layer of at least the first conducting element. Each sharp projection is disposed under a window in the metal layer, the edge of each window serving as a gate electrode cooperative with the sharp projection and the second conducting element to provide a switching or filter action.

In a yet further embodiment, a plurality of projections are disposed on the peaks and valleys of a rough surface without an insulating layer, the projections providing a variety of conduction modes. In particular, at least a portion of the projections disposed on the peaks contact a cooperative conducting element to form a-spots, and tunneling and fritting sites, and the projections disposed in the valleys are disposed in close proximity to, but spaced from the cooperative conducting element to form field emission sites.

The projections protrude from the rough surface less than approximately twenty microns and preferably, less than ten microns. This projection height range is slightly larger than the smoothness of the surface of the cooperative conducting element. This arrangement ensures that at least some of the projections will directly contact the cooperative conducting element to form a-spots, while others are spaced from the cooperative conducting element, thereby ensuring that the resulting structure supports current conduction by electron tunneling and field emission.

The aspect ratio of the sharp projections is between approximately one and five and preferably, is between approximately one and two. Projections formed with this preferred aspect ratio range are optimized so as to withstand the mechanical force applied to the conducting elements.

The tip of each projection is atomically sharp, with a tip radius of less than approximately 100 Ångstrom units, and preferably less than 50 Ångstrom units, so that a high intensity electric field can be produced in the vicinity of each projection tip. The preferred tip radius range represents an optimization based on the desirability of having sharp projection tips so that the projections which directly contact the cooperative conducting element form a-spots, and the shearing tendency associated with increasingly sharper tips which disadvantageously increases the wear rate of the resulting interconnection structure.

The sharp projections of the interconnection device of the invention serve as conduction sites, such as a-spots, tunneling sites, field emission sites, and fritting sites. Thus, conduction takes place without the need to apply significant mechanical pressure between the first and second conducting elements to create or increase the likelihood of these conduction sites. The sharp projections can be sharper than any randomly created conduction site, and they can be fabricated at higher area densities than the typical distribution of conduction sites as well. Thus, conduction can occur at lower applied voltages, higher surface contaminant densities, thicker insulating film thicknesses, and lower applied mechanical pressures. Furthermore, since it is no longer necessary for one of the contact elements to deform to create conduction sites, it is permissible to use harder materials, such as tungsten, titanium nitride, or silicon, thereby eliminating the need for more expensive and less durable soft metals, such as gold.

The invention is especially useful in high density, small signal applications where the excessive force required to produce low resistance contacts would be detrimental to standard connection devices, and in situations where the contact must be made and broken thousands of times over the life of the connecting device. The invention is also of great utility for making contact to the planar leads employed in surface mounted device technology. The alternate embodiment is particularly advantageous in applications that require a noise filter.

DESCRIPTION OF THE DRAWING

The invention will be more fully understood from the following detailed description, in conjunction with the accompanying figures, in which:

FIG. 1 is a Fermi level diagram;

FIGS. 2A and 2B are schematic representations of two conducting surfaces and an intervening dust particle;

FIG. 3 is a cut-away side view of a first embodiment with two sharp projections disposed within respective depressions in an insulating layer;

FIG. 4 is an pictorial view of a plurality of randomly distributed projections and their associated depressions;

FIG. 5 is a cut-away side view of a second embodiment with two sharp projections disposed within respective depressions and under respective windows in an overlying metallic layer.

DETAILED DESCRIPTION OF THE INVENTION

Figure 6E:
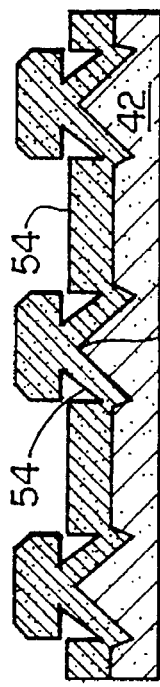
FIGS. 6A–6G represent a sequence of cut-away side views illustrating a process for forming three sharp projections with a metal layer.

With reference to FIG. 3, the interconnection device of the invention provides electrical interconnection between a first conducting element 22 and a second conducting element 24 such that less applied force is required than a standard ohmic connection device of the same connection area. The first conducting element 22 includes a metal substrate 26 with a plurality of integral sharp projections 28. Each sharp projection 28 is disposed at the bottom of a depression 30 in an insulating layer 32, and extends upward from the metal substrate 26 no further than the maximum thickness of the layer 32. Thus, there is a space between the tip 34 and the second conducting element 24. The tip of each projection 28 is atomically sharp, with a tip radius of less than, for example, 50 Ångstrom units, so that a high intensity electric field can be produced in the vicinity of the tip 34 of the projection 28. When the second conducting element 24 is brought into contact with the first conducting element 22, the distance from the second conducting element to the tip 34 of the projection 28 is preferably less than 1 μm. The sharp projections project from the conducting substrate a distance of less than or equal to approximately 1 μm.

With reference to FIG. 4, the sharp projections 28 and their associated depressions 30 are randomly distributed with a preferred average density of about, for example, $10^7$–$10^8$ projections/cm$^2$, so as to achieve current densities at least as great as those produced between two standard ohmic conducting elements.

Each tip 34 serves as a conduction site, where a-spots, tunneling sites, field emission sites, and fritting sites can occur. When a bias voltage 36 is applied across the first and second conducting elements 22, 24, extremely high electric fields are produced at each tip 34. For example, with an applied voltage of 10 volts, a sharp tip 34 with a radius of 50 Ångstrom units would produce an electric field of $5 \times 10^7$ V/cm. At this field strength, a second conduction element made of a metal with a work function of 4.5 eV, such as tungsten, would exhibit field emission. The emission current would be approximately 3 µA per tip. If the tips were fabricated at a density of $10^7$–$10^8$ tips/cm$^2$, a current density of 30 A/cm$^2$ would result.

In an alternate embodiment, shown in FIG. 5, a metal layer 38 is included that has a plurality of windows 40, each disposed in generally concentric relationship with a sharp tip 34. The width of the window 40 is less than the width of the depression at the surface of the insulating layer 32, and is approximately the same width as the base of the projection 28. When the metal layer 38 is biased with respect to the conducting substrate 26 by the voltage source 36, the portion of the metal layer 38 surrounding each tip 34 serves as a gate electrode that provides an electric field at each tip 34 to generate current by field emission at low voltages. Thus, the conducting element 22 can function as a switch or noise filter by biasing the metal layer 38 at a specific threshold voltage. For example, a connector for a multiconductor cable could have this threshold set to eliminate electrical interference transferred to the cable when it is exposed to potentially harmful fields. In particular, the effects of a large electromagnetic pulse (EMP) on sensitive equipment could possibly be reduced or eliminated by including an integrated sensor in the connector package to shut off the gate during an EMP event.

Thus, it is clear that the invention provides more conduction sites, and at a greater area density, where both the number and density of the sites is controllable during manufacturing. Furthermore, typical spontaneously formed a-spots have a radius of curvature on the order of $10^4$–$10^5$ Ångstroms, whereas the sharp tips of the invention have a radius of curvature of certainly no more than $10^2$ Ångstroms. Such small radii of curvature allow the invention to provide electric field strengths high enough to induce field emission, tunneling, and fritting using voltages applied to the conducting elements that are well within voltage ranges commonly found in contemporary electronic devices.

The structure of the first conducting element in this embodiment bears some similarity to a structure disclosed in Spindt et al., U.S. Pat. Nos. 3,789,471 and 4,857,799, and included in vacuum tubes and flat panel displays for energizing cathodoluminescent areas on a phosphor-coated face plate. Both references are silent on using arrays of sharp projections for increasing current density in an interconnection device, and furthermore, the arrays disclosed by Spindt are of insufficient area density to provide useful current densities. Moreover, the methods disclosed for fabricating the structures of Spindt are clearly distinguishable, the method of the instant invention being inexpensive and highly suitable for mass-production.

The interconnection device of the invention can be used in high density, small signal applications where the excessive force required to produce low resistance contacts would be detrimental to connection devices. Modern trends in semiconductor electronics are progressing towards ever increasing numbers of connections required from the electronic devices to the outside world. Most integrated circuits (ICs) are soldered into place on printed circuit boards. However, many ICs are placed into sockets that have been themselves soldered onto a printed circuit board. Chip sockets are used when a chip is very expensive and would be vulnerable to damage in a soldering operation. Chip sockets are also used when a chip must be replaced frequently, as in upgrades or testing prior to shipment from a manufacturer. Also, the invention is particularly useful for use with surface mounted devices, which are increasingly common on modern printed circuit boards. The connection mechanism of the invention is ideally suited for making contact to the planar leads found in surface mounted device technology.

Also, the invention provides improvement in wear resistance due to the reduced requirement for employing soft metals, such as gold, as contact materials. Improved wear resistance is useful in applications where contact must be made and broken thousands of times over the life of a connector, such as with "smart cards", the credit card-sized computers used sometimes in banking applications. Furthermore, electronic locks, and ROM modules for computers and peripherals could benefit greatly from the reduced insertion forces and decreased wear provide by use of the invention.

Figure 6F:
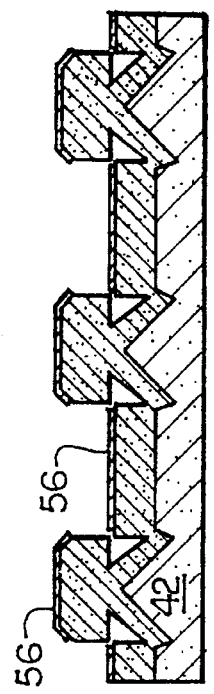
Figure 6G:
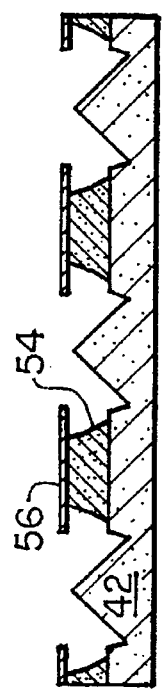
Figure 6H:
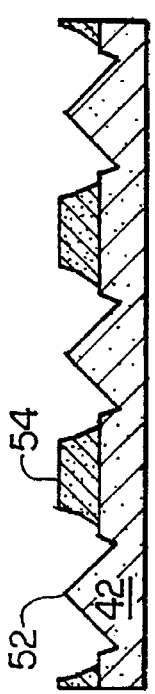
FIG. 6H represents a cut-away side view of the structure of FIG. 6G without a metal layer.
Figure 6A:
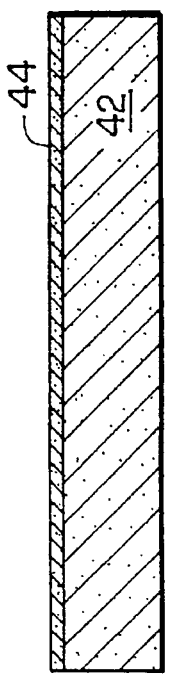
Figure 7:
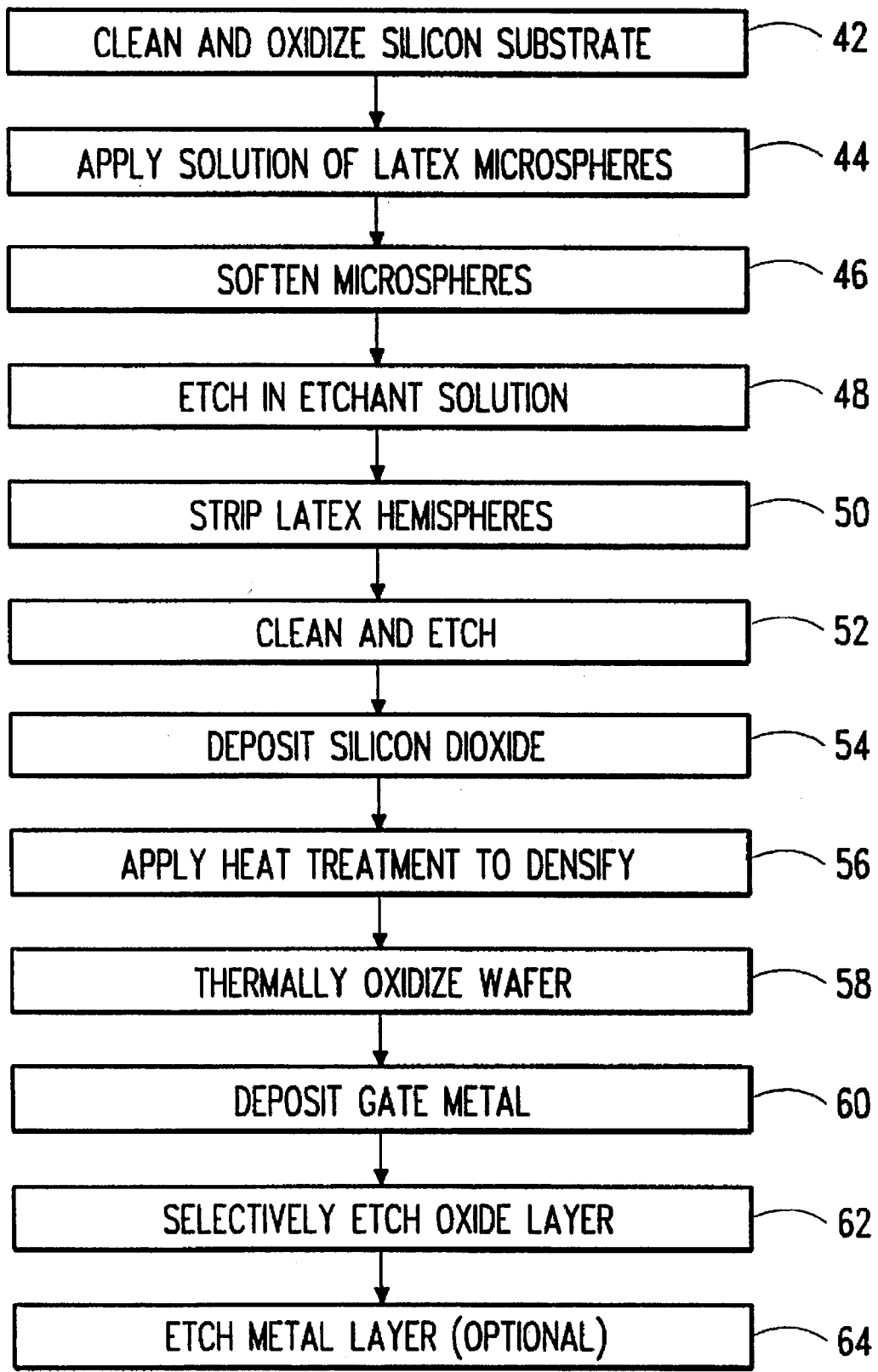
FIG. 7 is a flow diagram illustrating the process steps used to fabricate the sequence of structures in FIGS. 6A–6B.

To fabricate the array of projections and their associated depressions in the insulating layer, the following fabrication sequence can be used. Reference numbers in parentheses refer to process steps shown in FIG. 7. Referring first to FIG. 6A, a silicon substrate 42 is cleaned and oxidized (42) to a desired thickness to form an oxide layer 44. The oxide layer 44 must be thick enough to prevent significant erosion during a subsequent silicon etch step, and to decrease the amount of oxide grown vertically during a subsequent tip formation step. Silicon has been chosen due to its well-known fabrication characteristics and low cost, although other similar materials could be used.

To form a random distribution of contact sites, a solution of latex microspheres suspended in isopropanol is applied (44) using a photo resist spinner to distribute the spheres over the wafer. The microspheres are then softened (46) by heat to produce hemispheres 46 which act as masks for a subsequent oxide etch (48) in an etchant solution, such as HF/NH$_4$F solution, to remove the oxide layer everywhere except under the hemispheres 46. The resulting structure is shown in FIG. 6B.

Figure 6B:
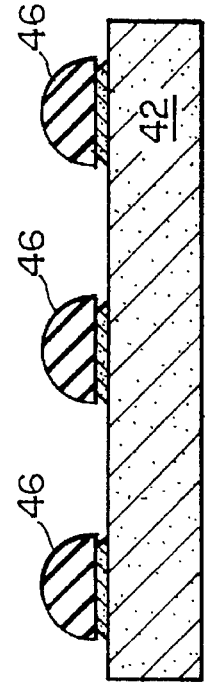
Figure 6C:
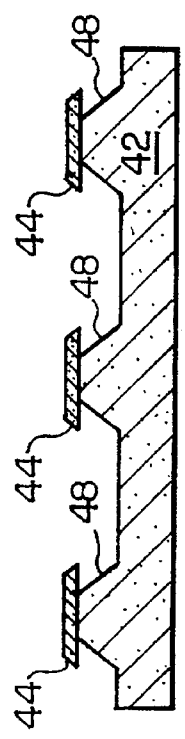

The mask of latex hemispheres 46 is stripped (50) in acetone, the wafer is cleaned, and the silicon is partially etched (52) to form a pedestal with oxide on top, as shown in FIG. 6C. The etching step (52) is critical, since it determines the size of the tip formed after a subsequent oxidation step.

Figure 6D:
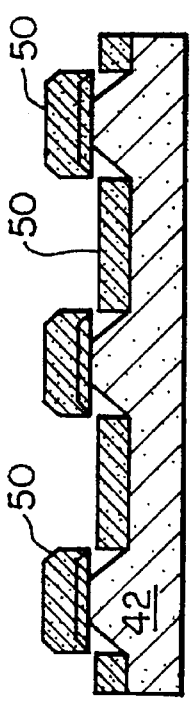

Silicon dioxide is then deposited (54) on the wafer by a method such as electron-beam evaporation, to provide a layer of deposited SiO$_2$ 50 shown in the profile shown in FIG. 6D. Evaporated films are of poor quality with respect to films formed by chemical vapor deposition and thermally grown films, since oxygen is liberated from the SiO$_2$ during deposition, resulting in films that are a mixture of Si, SiO, and SiO$_2$. A heat treatment step (56) is applied to densify the film and to restore stoichiometry. The thickness of the film determines the distance from the tip to the second conducting element, and so must be well controlled.

The wafer is then thermally oxidized (58) to form the structure in FIG. 6E. The thermal oxidation step (58) serves to densify and oxidize, thereby oxidizing the silicon pedestal 48 to form a silicon tip 52 underneath the oxide layer 54. Tips sharpened in this manner have a radius of less than 200 Ångstroms, which are ideal for this application.

In the next step, a gate metal layer 56 is deposited (60), to produce the structure shown in FIG. 6F. This metal layer serves to selectively protect the insulating oxide layer 54 during a subsequent tip definition etch step (62), which results in the profile of FIG. 6G, to provide the alternate embodiment that includes a metal gate surrounding each sharp tip of each conducting site. In this step, the insulating layer 54 is undercut under the metal layer 56. The extent of undercut depends on the etch rate of the insulating layer 54, which is a function of the extent of densification of the layer 54.

The metal layer 56 can optionally be stripped away (64) to produce the embodiment that includes solely the sharp tips 52 disposed within depressions in an insulating layer 54, as described above, and shown in FIG. 6H. The metal 56 can optionally be further patterned to provide a variety of metal gate geometries. It may also be useful to etch the oxide 54 to reduce the tip-to-collector distance, or to planarize the structure with a spin-on glass or polyimide. The silicon tips 52 could also be coated with a very thin layer of another conductor with a lower work function so as to improve the emission characteristics of the sharp tips 52.

Figure 8:
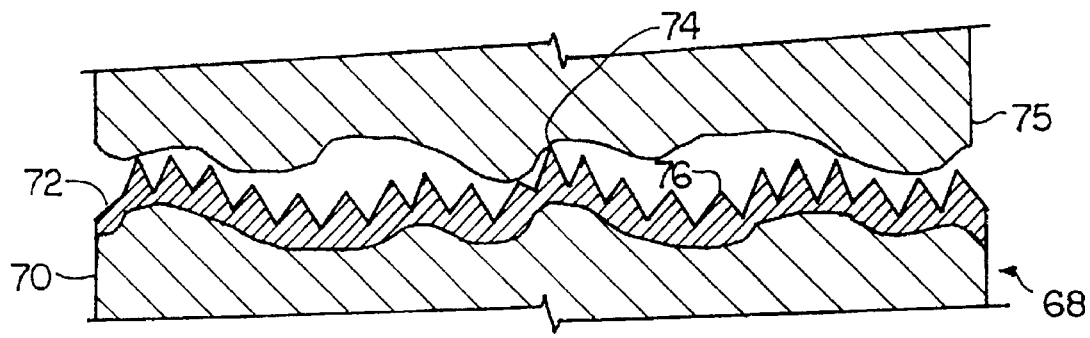
FIG. 8 is a cut-away side view of an alternate embodiment with a plurality of sharp projections disposed on peaks and within valleys of a rough surface of a first conducting element in contact with a rough surface of a second conducting element.
Figure 9A:
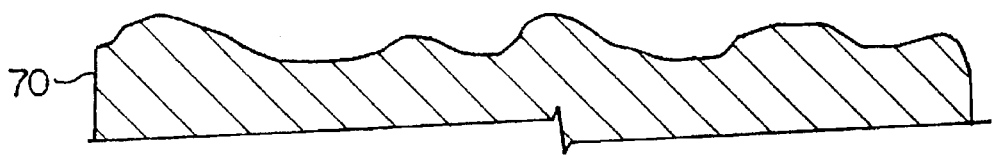
FIGS. 9A–9D represent a sequence of cut-away side views illustrating a process for forming the first conducting element of FIG. 8.
Figure 9B:
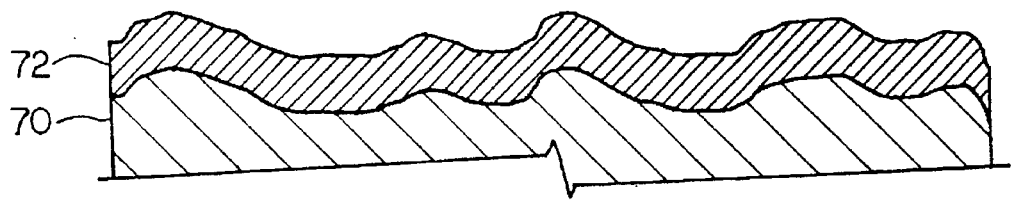
Figure 9C:
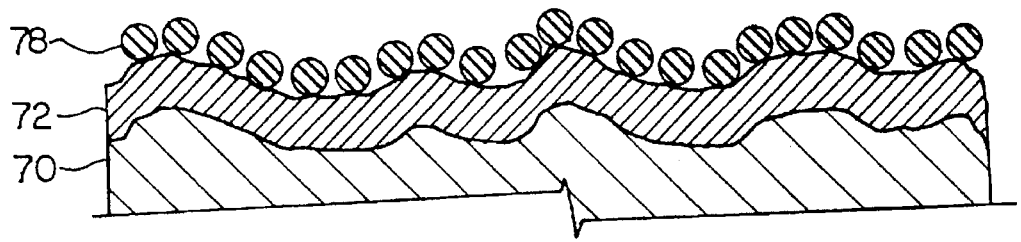
Figure 9D:
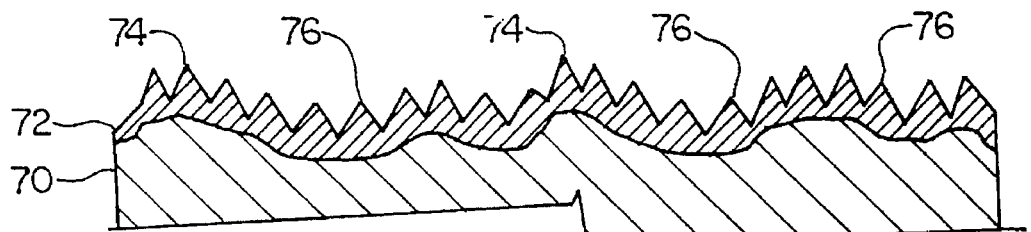

With reference to FIG. 8, a further interconnection device structure 68 is shown. A standard conducting element 70, such as one made from brass or beryllium copper, includes a film 72 of a hard, highly wear-resistant material, for example, which titanium nitride, for example, which has been etched to produce a plurality of sharp projections 74, 76. The conducting element 70 has a surface roughness such that a plurality of sharp projections can reside on each peak and valley of the surface. Sharp projections 74 are disposed on the peaks of the rough surface of the conducting element 70, and sharp projections 76 are disposed in the valleys thereof.

The projections provide a variety of conduction modes; the projections 74 disposed on the peaks form a-spots, and tunneling and fritting sites, and the projections 76 disposed in the valleys form field emission sites. Unlike the previously described embodiments, a protective insulating layer for is not formed. Instead, some projections 74 directly contact a cooperative conducting element, or conductor 75, and other projections 76 are disposed in close proximity to conductor 75 and therefore act as field emitters. Illustrative surface roughness of conducting element 75 is between approximately 1–3 µm.

The projections extend from the rough surface of element 70 by less than approximately twenty microns and preferably, by less than ten microns. In fact, in one embodiment, such height of projections 74, 76 is less than 1 micron. By forming the projections with a height slightly larger than the smoothness of the surface of the cooperative element 75, the incidence of the projections 74 contacting the cooperative conducting element 75 is optimized to ensure that the resulting structure supports current conduction by electron tunneling as well as by field emission. That is, even if the peaks of the rough surface on which the projections are formed are aligned with valleys of the confronting surface of the cooperating conducting element 75, at least some of the projections 74 formed on the peaks will span the aligned valleys of the surface of cooperative conducting element 75 to contact the surface of element 75. Preferably, the height of the projections is up to one to three microns greater than the surface roughness of the confronting surface of the cooperating conducting element 75.

The aspect ratio of the sharp projections (i.e., the ratio of projection height to diameter) is between approximately one and five and preferably, is between approximately one and two. The preferred aspect ratio range ensures that the projections are sturdy enough to withstand the mechanical force applied to the conducting elements. Note that the preferred aspect ratio of the projections limits the practical height of the projections somewhat, since the taller the projections, the fewer projections can be provided in a given surface area.

The tip of each projection is atomically sharp, with a tip radius of less than approximately 100 Ångstrom units, and preferably less than 50 Ångstrom units, so that a high intensity electric field can be produced in the vicinity of each projection tip. The preferred tip radius range represents an optimization based on the desirability of having sharp projection tips so that the projections which directly contact the second, cooperative conducting element form a-spots, and the shearing tendency associated with increasingly sharper tips which disadvantageously increases the wear rate of the resulting electrical interconnection structure.

Use of the above-described process for forming the sharp projections 74, 76 provides substantially uniformly sized and shaped projections. Uniformity among the projections is beneficial in view of the relatively small dimensions thereof and the effect of even slight variations in the projection dimensions on the integrity of the resulting electrical interconnection.

Figure 10:
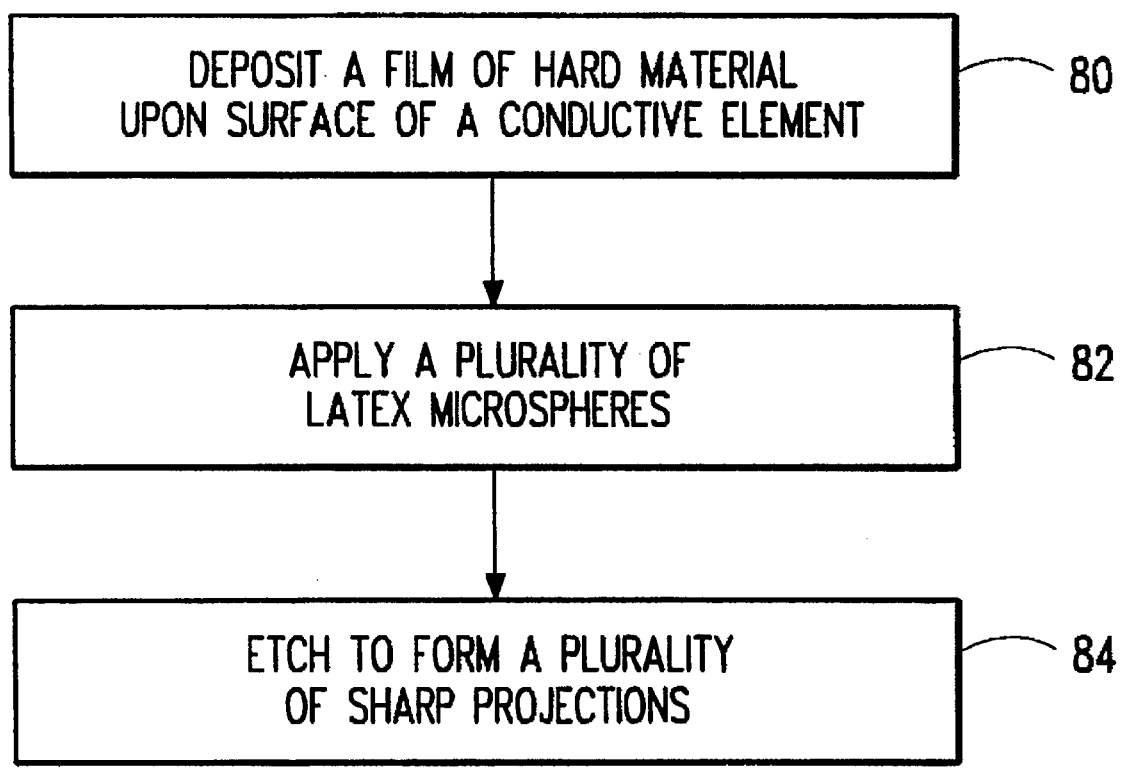
FIG. 10 is a flow diagram illustrating the process steps used to fabricate the sequence of structures in FIGS. 9A–9B.

With reference to FIG. 10, to form the structure 68, a film of a hard material 72, such as tungsten or titanium nitride, is deposited (80) upon the surface of the conducting element 70. Then, a plurality of latex microspheres 78 is applied (82) by either immersing or spraying the coated conducting element with a solution of latex microspheres. Last, the film 72 is etched (84) by either a wet method, such as wet chemical etching, or a dry method, such as reactive ion etching, to form a plurality of sharp projections 74, 76.

Other modifications and implementations will occur to those skilled in the art without departing from the spirit and the scope of the invention as claimed. Accordingly, the above description is not intended to limit the invention except as indicated in the following claims.

What is claimed is:

1. An interconnection device for providing electrical connection between two separable conducting elements, said device comprising:

a conducting substrate;

a film of a hard wear-resistant material with a plurality of sharp projections disposed upon said conducting substrate, said sharp projections projecting from said conducting substrate a distance less than or equal to approximately 20 µm; and a cooperative conducting element in separable contact with said film, wherein, when said film of hard wear-resistant material contacts said cooperative conducting element, some sharp projections directly contact said cooperative conducting element, and other sharp projections are disposed in close proximity to said cooperative conducting element, wherein said cooperative conducting element has a surface with a surface roughness and wherein said sharp projections project from said conducting substrate a distance slightly greater than said surface roughness of said surface of said cooperative conducting element.

2. An interconnection device for providing electrical connection between two separable conducting elements, said device comprising:

a conducting substrate;

a film of a hard wear-resistant material with a plurality of sharp projections disposed upon said conducting substrate, said sharp projections having sharp tips having a radius of curvature less than or equal to substantially 100 Å; and a cooperative conducting element in separable contact with said film, wherein said cooperative conducting element has a surface with a surface roughness and wherein said sharp projections project from said conducting substrate a distance slightly greater than said surface roughness of said surface of said cooperative conducting element.

3. The interconnection device of claim 2 wherein said sharp projections project from said conducting substrate a distance of less than or equal to approximately 20 μm.

4. The interconnection device of claim 2 wherein said sharp projections project from said conducting substrate a distance of less than or equal to approximately 10 μm.

5. The interconnection device of claim 2 wherein said sharp projections project from said conducting substrate a distance of less than or equal to approximately 1 μm.

6. The interconnection device of claim 2 wherein said sharp projections have an aspect ratio approximately equal to one.

7. An interconnection device for providing electrical connection between two separable conducting elements, said device comprising:

a conducting substrate;

a film of a hard wear-resistant material with a plurality of sharp projections disposed upon said conducting substrate; and a cooperative conducting element in separable contact with said film so that a first plurality of said sharp projections contact said cooperative conducting element and a second plurality of said sharp projections are in spaced relationship with respect to said cooperative conducting element, wherein said cooperative conducting element has a surface with a surface roughness and wherein said sharp projections project from said conducting substrate a distance slightly greater than said surface roughness of said surface of said cooperative conducting element.

* * * * *